(12) United States Patent
Gendai

(10) Patent No.: US 6,480,135 B2
(45) Date of Patent: Nov. 12, 2002

(54) FLASH TYPE ANALOG-TO-DIGITAL CONVERTER

(75) Inventor: Yuji Gendai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/842,061

(22) Filed: Apr. 26, 2001

(65) Prior Publication Data

US 2001/0040523 A1 Nov. 15, 2001

(30) Foreign Application Priority Data

Apr. 27, 2000 (JP) .................................. 2000-132863
Jun. 6, 2000 (JP) .................................. 2000-168691

(51) Int. Cl.[7] .......................... H03M 1/12; H03M 1/36
(52) U.S. Cl. .................................. 341/159; 341/156
(58) Field of Search ........................ 341/156, 159, 341/160, 64, 145, 118, 120; 375/247; 327/64; 708/7

(56) References Cited

U.S. PATENT DOCUMENTS

| 4,276,543 A | 6/1981 | Millet et al. | |
|---|---|---|---|
| 4,386,339 A | 5/1983 | Henry et al. | |
| 5,623,265 A | * 4/1997 | Pawar et al. | ................ 341/160 |
| 5,644,312 A | * 7/1997 | Deevy et al. | ................ 341/160 |
| 6,222,476 B1 | * 4/2001 | Lee et al. | ................ 341/159 |

OTHER PUBLICATIONS

"An 8b 250 MHZ A/D Converter", IEEE International Solid–State Circuits Conference, Feb. 20, 1986, Digest of Technical Papers, pp. 136–137.

* cited by examiner

Primary Examiner—Patrick Wamsley
(74) Attorney, Agent, or Firm—Radar, Fishman, & Grauer PLLC; Ronald P. Kananen, Esq.

(57) ABSTRACT

An ADC having a sparkle suppression capability equivalent to that of a full bit Gray encoding method and preventing criss-crossing of interconnections nor an increase of the pipeline delay, wherein a resistor string for generating reference voltages to be compared with an analog input signal is folded $2^n$ times or a multiple thereof corresponding to the number n of most significant bits of the output bit ADB of the related ADC. It has a first encoder for encoding the most significant n bits and outputting a Gray code, second encoders for encoding least significant bits and outputting the same, a first output circuit for converting the Gray code output from the first encoder to a binary code and generating most significant n bits, and a second output circuit for generating least significant bits by using the digital code generated by the first output circuit and the output of the second encoder.

25 Claims, 10 Drawing Sheets

FLASH TYPE ANALOG-TO-DIGITAL CONVERTER

BACKGROUND OF THE INVENTION

1. Field of the Invention

The present invention relates to a flash type analog-to-digital converter of a plurality of reference voltages different by predetermined voltage steps and comparing the related plurality of reference voltages with an analog input signal in parallel to convert the analog input signal to a digital code of predetermined bit width.

2. Description of the Related Art

As an ultra-high speed analog-to-digital converter (hereinafter referred to as an "ADC"), a configuration known as a flash type has been used. Its prototype goes back to U.S. Pat. No. 4,276,543 (filed on Mar. 19, 1979).

A flash ADC, in principle, comprises ($2^N-1$) comparators to generate N-bit output. Each comparator has two inputs. One is common to all comparators and is connected to the analog signal input. The other input of each comparator is connected to an input reference potential which differs by 1 LSB from adjacent one. The input analog signal is first converted to a code called a "thermometer code" by the comparator array. This terminology comes from the region of comparators of "1" indicating that the input signal is higher than the reference voltage increases or decreases like an alcohol thermometer in accordance with the analog input voltage.

The thermometer code is converted to an impulsive code which has only "1" at the border of the thermometer code by a so-called differentiation circuit, then is converted to a final binary code. The last encoder (often referred as a "decoder" in literature quite confusingly) usually employs a ROM structure using a wired OR (WOR).

Below, an explanation will be given of a 4-bit ADC by using logic formulae.

The outputs of the comparators are represented by C[i] (i=1, 2, ..., 15). This C[i] array forms a thermometer code. In the thermometer code, when an input level is in a semi-closed interval [i, i+1), the comparator outputs from C[1] to C[i] are "1", and the remaining comparator outputs, that is, C[i+1] to C[15], are "0".

The differentiation circuit is expressed by the following formula (1).

$$D[i]=C[i]\&!C[i+1] \quad (1)$$

$$(i=1, 2, \ldots, 14)$$

Here, "&" denotes a logical multiplication, and "!" denotes a bit inversion.

The encoder binary output is expressed by the following formula (2).

$$ADB[3:0] = (D[1] \&'0001')|$$
$$(D[2] \&'0010')|$$
$$(D[3] \&'0011')|$$
$$(D[4] \&'0100')|$$
$$(D[5] \&'0101')|$$
$$(D[6] \&'0110')|$$
$$(D[7] \&'0111')|$$
$$(D[8] \&'1000')|$$
$$(D[9] \&'1001')|$$
$$(D[10] \&'1010')|$$
$$(D[11] \&'1011')|$$
$$(D[12] \&'1100')|$$
$$(D[13] \&'1101')|$$
$$(D[14] \&'1110')|$$
$$(D[15] \&'1111') \quad (2)$$

Here, '0001' etc. are 4-bit constants, and "ADB" is the 4-bit ADC output of the binary code format. Also, "&" denotes a logical multiplication (AND), and "|" denotes a logical sum (OR). Each D[i] of equation (1) is extended to 4 bits and applied in equation (2).

An example of the configuration of a conventional parallel type analog-to-digital converter is shown in FIG. 10.

A resistor string equivalently expressed by a series connection of for example 16 resistor elements R16, R15, ..., and R1 is provided between the reference voltages VRT and VRB. Connection points of the resistor elements in the resistor string are connected to inverting terminals (−) of 15 comparators C15, C14, ..., and C1. Analog signal Vin is input to non-inverting terminals (+) of the comparators C15, C14, ..., and C1.

The differentiation circuit is comprised of AND gates A15, A14, ..., and A1. According to equation (1), 14 AND gates of A14, A13, ..., and A1 are connected to corresponding comparator outputs C[i] and the invert of C[i+1] respectively. The output C[15] of the comparator C15 of the most significant bit is input to the two input terminals of the AND gate A15, whereby the comparator C15 acts as a buffer.

The encoder ECD1 comprises a ROM circuit of for example the WOR configuration. The double circle marks in the figure indicate elements functioning as OR logic inputs from the outputs D[i] of the differentiation circuit.

The outputs D[i] of the differentiation circuit (AND gates A15, A14, ..., and A1) are input to the encoder ECD1 and converted to a 4-bit binary code format digital signal ADB [3:0] according to equation (2).

The most significant bit (MSB) of ADB [3:0], that is, ADB[3], is found in the OR logics of the outputs D[15], D[14], ..., and D[8] of the differentiation circuit. Similarly, ADB[2] is found in the OR logics of the outputs D[15], D[14], D[13], D[12], D[7], D[6], D[5], and D[4] of the differentiation circuit, while ADB[1] is found in the OR logics of the outputs D[15], D[14], D[11], D[10], D[7], D[6], D[3], and D[2] of the differentiation circuit. Also, the least significant bit (LSB) of ADB [3:0], that is, ADB[0], is found in the OR logics of the outputs D[15], D[13], D[11], D[9], D[7], D[5], D[3], and D[1] of the differentiation circuit.

In an ADC of the configuration, assume for example the level of the now input analog signal Vin is at the seventh level among the 15 voltage ranges (hereinafter simply referred to as levels) obtained by dividing equally into 16 intervals from 16 resistor elements, that is, the input level is in the semi-closed interval [7,8). At this condition, seven comparator outputs C[1], C[2], ..., and C[7] indicate 1, while the remaining eight comparator outputs C[8], C[9], ..., and C[15] indicate 0. So that, the only A7 AND gate output D[7] in the differentiation circuit indicates 1, while all of the remaining AND gate outputs indicate 0. Hence in the OR logic of the encoder ECD1, only the most significant bit becomes 0, so ADB[3:0]='0111' is the output of the ADC.

At the next instant, let assume the input level slightly rises to the eighth level, that is, it shifts to the semi-closed interval [8,9). At this time, in addition to the seven comparator outputs C[1], C[2], ..., and C[7], the eighth comparator output C[8] also turns to 1. As a result, the AND gate output of the state 1 in the differentiation circuit moves from D[7] to D[8]. Accordingly, the OR logic result of the encoder ECD1 becomes 1 only at the most significant bit. The output ADB[3:0] of the ADC changes from '0111' to '1000'.

In flash type ADC, this parallel mechanism converts the voltage level of the analog input signal to a 4-bit digital code very fast.

The problem of this encoding scheme resides in that, if there is a bubble error which is an invalid thermometer code, or at the occurrence of a metastable state, a large error called "sparkle" arises. For example, when the input level is around the seventh level, if not only C[1] to C[7], but also C[9] become 1 then a bubble error occurs. In this case, the outputs of the differentiation circuit becomes 1 not only at D[7], but also at D[9], so the output code appears to be a large error since ADB[3:0]='0111'|'1000'='1111'. The bubble of the thermometer code and the sparkle due to that are apt to occur when the frequency of the analog input is high.

In order to deal with this problem, various method have been conceived of. The basis of many of them is the Gray code.

The encoder output using a Gray code is described as the following formula (3).

$$ADG[3:0] = (D[1]\ \&'0001')|\qquad(3)$$
$$(D[2]\ \&'0011')|$$
$$(D[3]\ \&'0010')|$$
$$(D[4]\ \&'0110')|$$
$$(D[5]\ \&'0111')|$$
$$(D[6]\ \&'0101')|$$
$$(D[7]\ \&'0100')|$$
$$(D[8]\ \&'1100')|$$
$$(D[9]\ \&'1101')|$$
$$(D[10]\ \&'1111')|$$
$$(D[11]\ \&'1110')|$$
$$(D[12]\ \&'1010')|$$
$$(D[13]\ \&'1011')|$$
$$(D[14]\ \&'1001')|$$
$$(D[15]\ \&'1000')$$

The configuration of an ADC implementing the Gray-code output shown in this equation (3) by a ROM circuit (encoder) adopting a WOR configuration is shown in FIG. 11.

The outputs D[i] of the differentiation circuit (AND gates A15, A14, ... and A1) are input to the encoder ECD 2 and converted to a 4-bit Gray code digital signal ADG[3:0] according to equation (3).

The MSB of ADG[3:0], that is, ADG[3], is found in the OR logics of the outputs D[15], D[14], ..., and D[8] of the differentiation circuit. Similarly, ADG[2] is found in the OR logics of the outputs D[11], D[10], D[9], D[8], D[7], D[6], D[5], and D[4] of the differentiation circuit, while ADG[1] is found in the OR logics of the outputs D[13], D[12], D[11], D[10], D[5], D[4], D[3], and D[2] of the differentiation circuit. Also, the LSB of ADG[3:0], that is, ADG[0], is found in the OR logics of the outputs D[14], D[13], D[10], D[9], D[6], D[5], D[2], and D[1] of the differentiation circuit.

A Gray code is characterized that the adjoining codes differ only 1 bit, so a bubble does not make a sparkle. For example, if D[7]=D[9]=1, then, ADG[3:0]='0100'|'1101'= '1101', which is the output corresponding to D[9] and is not a sparkle.

However, the "metastable state" phenomenon where the boundary of the thermometer code becomes unsettled cannot be eliminated by just combining the differentiation circuit with a Gray encoder. Metastable state means that an output level of a comparator does not stably become the low level or high level, but stays in some intermediate level "M" (hereinafter, referred to as an M level) even if the comparator is in a latch state. Metastable state occurs when a voltage difference between the analog input and the reference is small and/or an operating speed is fast. If the metastable state occurs, all D[i]s may become 0 or judgement of D[i] may differ for each bit. These are causes of a sparkle that a simple Gray encoder cannot suppress.

In order to prevent this, direct Gray encoding from the comparators is effective. When expressing this method by logic formulae, the following formulae (4-1) to (4—4) are obtained:

$$ADG[3]=C[8] \qquad(4\text{-}1)$$
$$ADG[2]=C[4]\&!C[12] \qquad(4\text{-}2)$$
$$ADG[1] = (C[2]\ \&!C[6])|\qquad(4\text{-}3)$$
$$(C[10]\ \&!C[14])$$
$$ADG[0] = (C[1]\ \&!C[3])|\qquad(4\text{-}4)$$
$$(C[5]\ \&!C[7])|$$
$$(C[9]\ \&!C[11])|$$
$$(C[13]\ \&!C[15])$$

In this encoding method, each of the comparator outputs C[1] to C[15] appears only once in the formulae. The metastable state usually occurs only in one comparator at the border of the thermometer code. Accordingly, when configuring the comparators according to the above formula (4-1) to formula (4—4), at most only one bit in the output code becomes indeterminate. The indeterminate state one bit values only 1 LSB difference of the input level because of the nature of the Gray code described above. For this reason, it becomes possible to completely suppress the occurrence of sparkle by the method of the direct Gray coding of the comparators.

On the other hand, the above method of direct Gray encoding has a drawback that the outputs of the comparators are complexly combined. If the comparators are arranged in the order of the reference voltages, the interconnection lengths of the comparator outputs become long. This spoils the conversion speed. One remedy is to move the crossing before the comparator array. Since the reference voltages are constant, there is no problem in speed even if the interconnections become long. Note that, noise immunity become an issue in this layout.

Such an idea is fairly old. The germ of the idea can be found in U.S. Pat. No. 4,386,339 filed on Apr. 5, 1982.

The other method to prevent criss-crossing of the interconnections is the technique of shaping the resistor string into a long spiral, which has been published in ISSCC of 1986 ("An 8b 250 MHZ A/D Converter", IEEE International Solid-State Circuits Conference, Feb. 20, 1986, DIGEST OF TECHNICAL PAPERS, pp. 136–137). This technique is attractive because the interconnections are simple both in comparator inputs and outputs.

Though direct Gray encoding has the advantage of metastable state tolerance, it is still necessary to convert the Gray code into a binary code. Since Gray code is difficult for digital data processing after the ADC, the conversion to a binary code is necessary. Further, although there may be some exceptions, there are many applications not allowing the pipeline delay accompanied with Gray-binary conversion.

In an ADC using the conventional system, excessive time is taken for the Gray-binary conversion, so there was room for improvement in this point.

When expressing the 4-bit Gray-binary conversion by logic formulae, the following formulae (5-1) to (5-4) are obtained:

$$ADB[3]=ADG[3] \tag{5-1}$$
$$ADB[2]=ADG[2]*ADB[3] \tag{5-2}$$
$$ADB[1]=ADG[1]*ADB[2] \tag{5-3}$$
$$ADB[0]=ADG[0]*ADB[1] \tag{5-4}$$

Here, the symbol "*" denotes an exclusive OR "XOR". It is clear that these general formulae can be expressed by ADB[i]=ADG[i]*ADB[i+1] except the most significant bit.

The problem in the implementation of the formulae is that one higher significant bit ADB exists in the right hand side of the conversion formulae (5-2) to (5-4). For this reason, more significant bits of the ADC propagate more gates to the final binary code. Also, an XOR gate is harder to realized than an OR gate. Particularly, the lookahead technique is hard to use for XOR gates. This makes the problems more difficult when the ADC bites become wider.

In saying, the lookahead technique, this means the technique of direct expansion of the logic, increase the speed at the cost of increasing number of gates for example ADB[1] as follows.

$$ADB[1]=ADG[1]*ADG[2]*ADG[3] \tag{6}$$

SUMMARY OF THE INVENTION

An object of the present invention is to provide an ADC neither complex interconnections nor an increase of the pipeline delay while having a sparkle suppression capability equivalent to the Gray code.

According to a first aspect of the present invention, a flash type analog-to-digital converter is provided which has a resistor string for generating reference voltages when detecting a voltage level of an input signal at the time of conversion of an analog input signal to a digital code of predetermined bits. The resistor string is folded $2^n$ times or a multiple of it, where n is a width of most significant bits when dividing the predetermined bits N to most significant bits and least significant bits.

Preferably, provision is further made of a first encoder for encoding most significant n bits and outputting a Gray code and a second encoder for encoding the remaining least significant N-n bits.

These first and second encoders preferably have $(2^N-1)$ comparators receiving as input the reference voltages different by predetermined voltage steps and the input signal, comparing the input signal with the reference voltages, and generating an output code in accordance with the relative magnitudes. The $(2^N-1)$ comparators are grouped into $2^{N-n}$ blocks of comparators receiving as input the reference voltages different by increments of $2^{N-n}$ times the predetermined voltage step and being arranged around the resistor string.

The first encoder preferably directly converts a thermometer code output by the comparators in the blocks to a Gray code.

The second encoder preferably has a plurality of logic circuits for detecting state change of logics of (2m−1)th comparator outputs and 2m-th comparator outputs (m: natural number of $2^{n-1}$ or less) in the blocks, and an OR gate circuit for operating a logical sum of the outputs of the plurality of logic circuits and outputting the same.

Preferably, provision is further made of a first output circuit for converting the Gray code output from the first encoder to a n-bit binary code and a second output circuit for generating the remaining N-n bits of digital signal among the predetermined bits N by using the digital signal generated by the related first output circuit and the output of the second encoder.

In this case, the first output circuit may employ a configuration of outputting all or part of the n bits earlier than the other bits.

According to a second aspect of the present invention, there is provided a flash type analog-to-digital converter for generating a plurality of reference voltages different in increments of predetermined voltage steps, comparing the related plurality of reference voltages and an analog input signal in voltage in parallel to detect the voltage level of the analog input signal, and converting the same to a digital signal of predetermined bits, having a first encoder for encoding most significant n bits of the voltage level of the predetermined bits N and outputting a Gray code, a second encoder for encoding the remaining bits among the predetermined bits N and outputting the same, a first output circuit for converting the Gray code output from the first encoder to a binary code and creating n bits of digital signal, and a second output circuit for creating the remaining bits of the digital signal except the n bits from the predetermined bits N by using the digital signal generated by the related first output circuit and the output of the second encoder.

In the flash type analog-to-digital converter of the present invention comprised as described above, since the resistor string is folded in accordance with the number n of the most significant bits, the comparators of n bits are arranged close together. Accordingly, the reference voltages are input to comparator blocks obtained by the group of n bits of the comparators by short interconnections, and the Gray code is directly output from the comparator blocks. The Gray code outputs from the comparator blocks corresponding to the n bits is converted to a binary code in the first output circuit and output as n-bit digital output signal from the related flash type analog-to-digital converter after adjustment of timing stages.

On the other hand, in the comparator blocks corresponding to the remaining bits, the remaining bits are encoded and output. With respect to these outputs, logic operations using the n bits converted to the binary code in the first output circuit are applied to the second output circuit. The remaining bits of digital output signal are generated by this and output from the related flash type analog-to-digital converter after the adjustment of timing stages.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, a preferred embodiment will be described with reference to the accompanying drawings.

Figure 1:
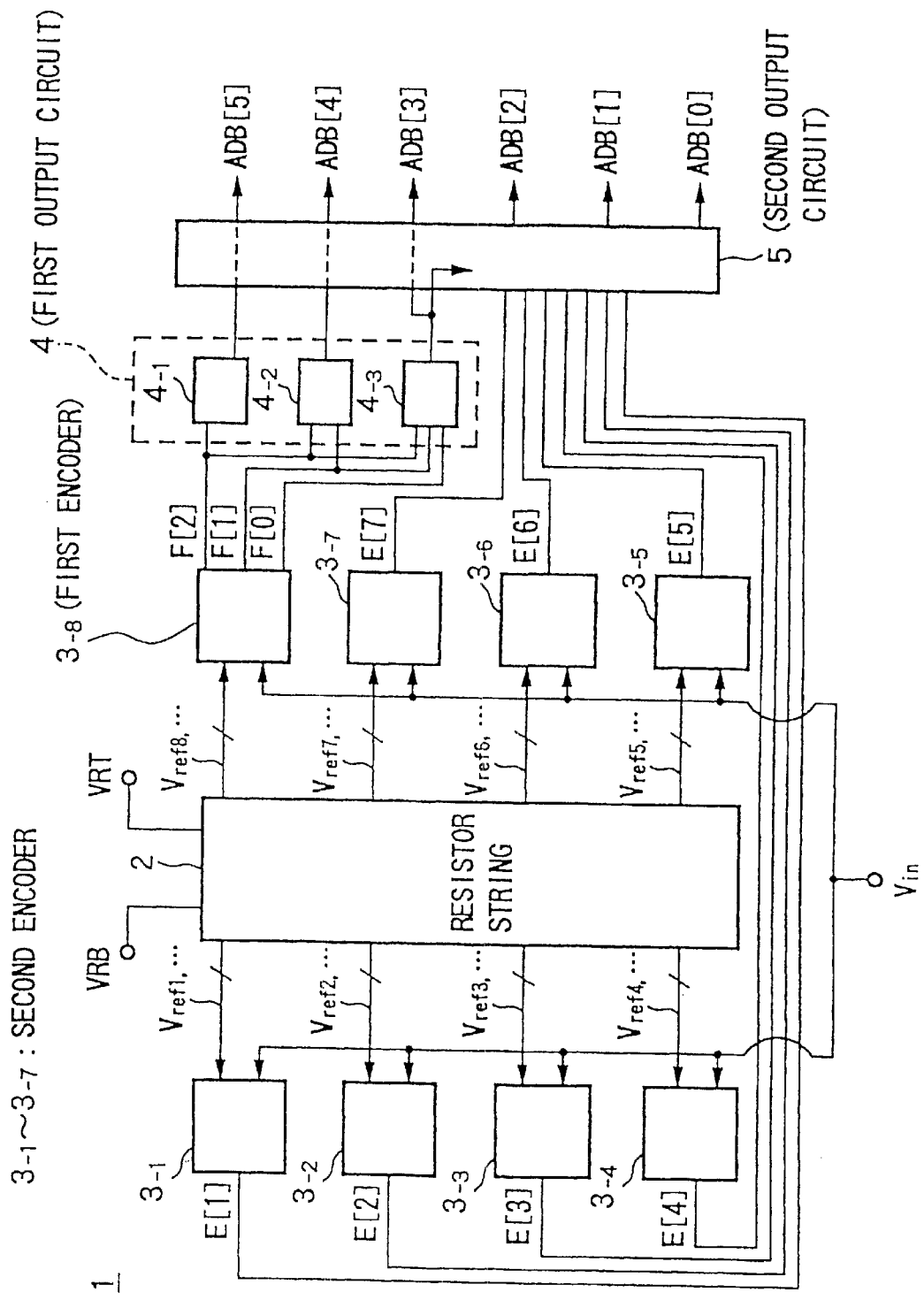
FIG. 1 is a block diagram of an analog-to-digital converter (ADC) according to the present embodiment.

FIG. 1 is a block diagram of an analog-to-digital converter (ADC) according to the present embodiment.

In this ADC 1, a resistor string 2 forming reference voltages is arranged folded a plurality of times at the center portion of the ADC. A plurality of, here, eight comparator blocks $3_{-1}$ to $3_{-8}$ are arranged at the periphery thereof. The comparator blocks $3_{-1}$ to $3_{-8}$ compare the analog input signal Vin with the reference voltages Vref from the resistor string 2 and output signals E[1] to E[7] or F[0] to F[2].

The ADC 1 also includes a first output circuit 4 including three conversion circuits $4_{-2}$, $4_{-1}$, and $4_{-0}$ for creating most significant three bits ADB[5], ADB[4], and ADB[3] among digital signals of the binary code format from the outputs F[2], F[1], and F[0] of the comparator block $3_{-8}$ and a second output circuit 5 for generating least significant three bits ADB[2], ADB[1], and ADB[0]. Note that, the second output circuit 5 will include some latch stages for outputting the most significant three bits in synchronization with the least significant three bits.

As the resistor string 2, a high uniformity of resistivities is necessary so that, for example, the interconnection metal is used. When there is variation of the resistivities that depend on the place in the IC, it appears as integral nonlinearity of the ADC. This resistor string placement reduces the effects because the resistor string is as compact as possible.

When the comparators are realized by a bipolar process, there is the phenomenon that the reference voltages shift due to base currents. For this reason, a value of about 1 Ω to several tens of Ω per LSB is adopted. A metal resistor having a low resistivity is preferred for the realization thereof. If the comparators are implemented by a MOS process, a larger resistivity such as a polysilicon resistor is feasible. To use larger resistivity has an advantage over a consumption power to generate the reference voltages. Process choice of ADC of this invention is not limited, but only for explanation, select a combination of the bipolar process and the metal resistor for the resistor string.

A voltage deciding the most significant bit reference voltage VRT is supplied to one end of the resistor string 2, while a voltage deciding to the least significant bit reference voltage VRB is supplied to the other end. The exact voltages to be supplied to the two ends of this resistor string 2 are voltages shifted from the most significant bit reference voltage VRT or the least significant bit reference voltage VRB by necessary offsets.

In order to realize an N-bit flash type ADC, $(2^N-1)$ number of comparators are necessary. Accordingly, when equally dividing the resistor string to $2^N$, reference voltages Vref1, Vref2, ..., and Vref$2^N$-1 gradually increasing by a predetermined step value appear at the $(2^N-1)$ division points (taps) thereof. The reference voltages Vref1, Vref2, ..., and Vref$2^N$-1 are grouped by a predetermined rule explained below and input to the corresponding comparator blocks.

When the resistor string is folded m-times, the picking-up points of the reference voltages become close at intervals of m steps among the reference voltages Vref1, Vref2, ..., and Vref$2^N$-1. In the present embodiment, the grouping of the comparators to be included in the comparator blocks is carried out by utilizing this.

At this time, the number m of turns of the resistor string is determined by the number N of bits the digital signal to be generated. As an extreme, in order to picking-up positions of the reference voltages match an N-bit digital signal, m should be equal to $2^N$. For example, in a 2-bit ADC, the resistor string is folded 4 times, while in a 4-bit ADC, the resistor string is folded 16 times.

Further, in the present invention, the number N of bits of the ADC is divided to the most significant n bits and least significant (N-n) bits. By doing this, the number of turns of the resistor string may be $2^n$ ($<2^N$) depending upon the number n of most significant bits. For example, when the number of most significant bits of the 4-bit ADC is selected as 2, the resistor string should be folded 4-times. Also, when the number of most significant bits of a 6-bit ADC is chosen as 3, the resistor string may be folded 8 times.

Note that, in this flash ADC, although the details will be explained later, the most significant bits generate a Gray code, while the least significant bits are generated by utilizing the result thereof. The reason for dividing the most significant bits and the least significant bits is rather the demand to use a Gray code these most significant bits.

In the ADC according to the present embodiment, the analog input signal is converted to a binary code format 6-bit digital output signal. Accordingly, $2^6-1=63$ comparators are necessary. Here, serial numbers are sequentially attached to 63 comparators from the one using the reference voltage on the side nearest the least significant bit reference voltage VRB side and described as C01, C02, C03, . . . , C63. Also, lines for pickup from the resistor string to the comparators are laid in a direction orthogonal to a parallel stripe portion of the resistor string. Further, the direction of assigning the comparators to the left and right of the parallel stripe portion of the resistor string is changed for every four comparators. Namely, first four comparators C01 to C04 are arranged on the left side of the resistor string, and the next four comparators C05 to C08 are arranged on the right side of the resistor string. Below, similarly, every four comparators among the remaining comparators C09 to C63 are alternately arranged on the left and right.

Figure 2:
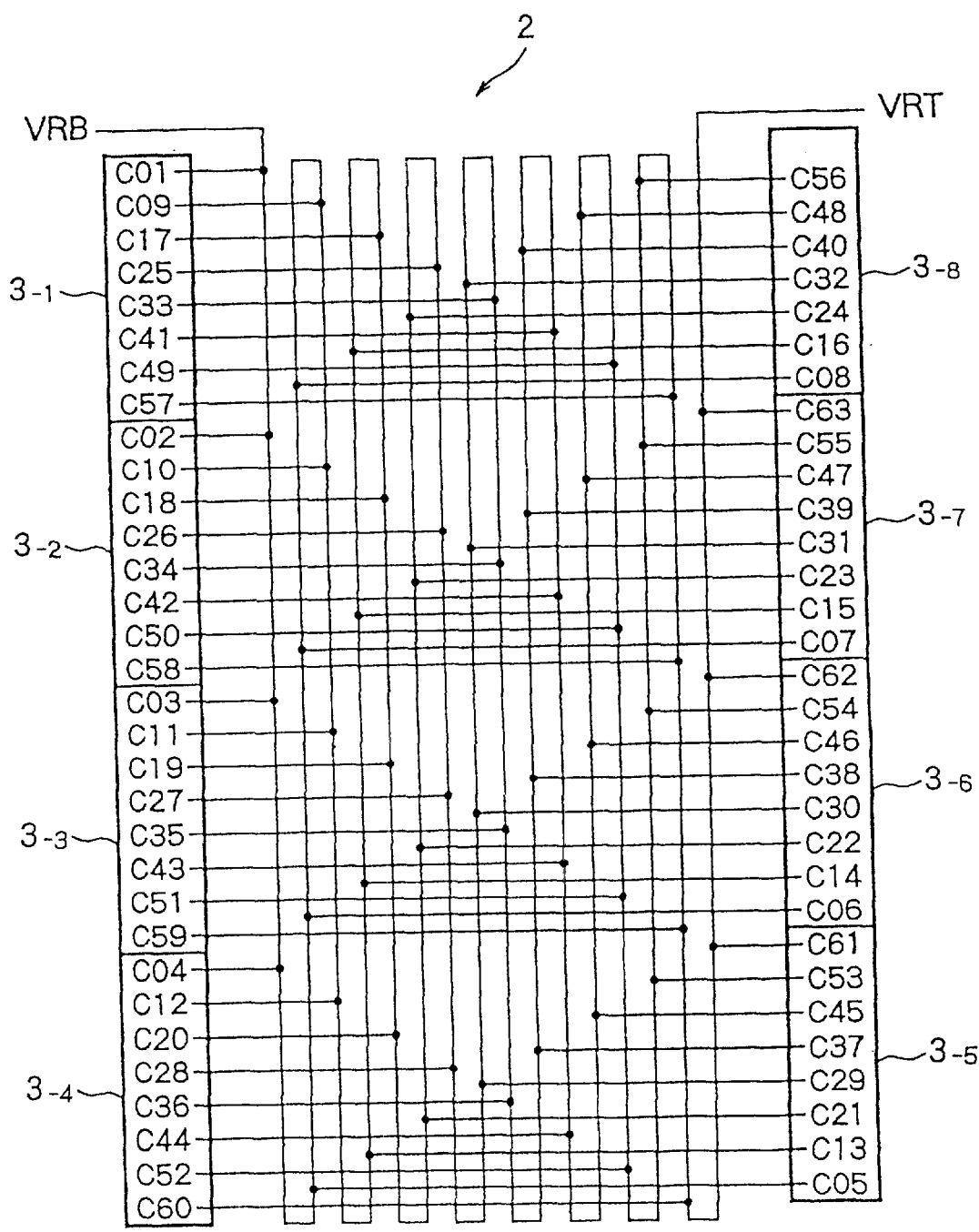
FIG. 2 is a view of a first example of a position and a connection configuration of a resistor string and comparators according to the present embodiment.
Figure 3:
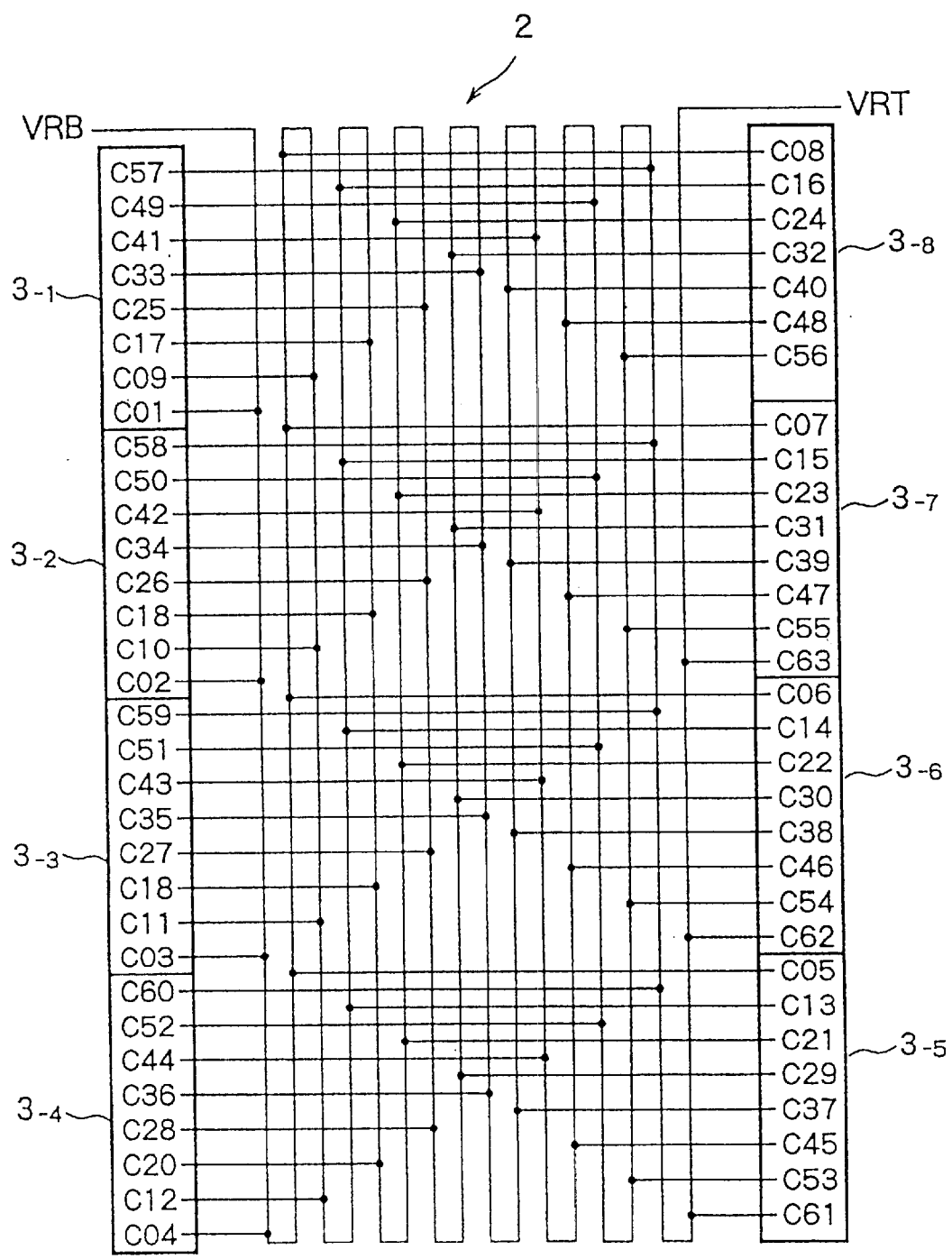
FIG. 3 is a view of a second example of a position and a connection configuration of a resistor string and comparators according to the present embodiment.
Figure 4:
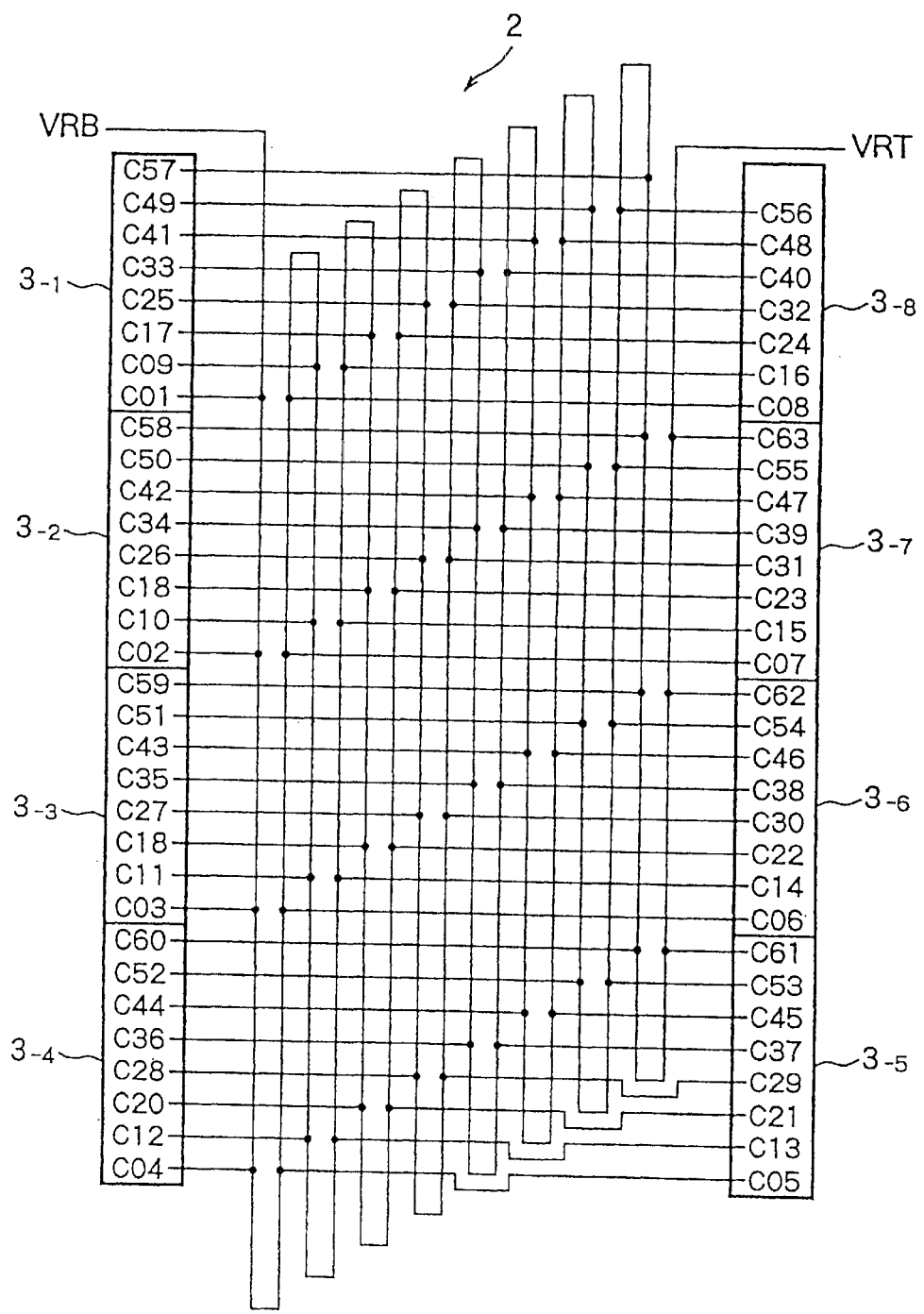
FIG. 4 is a view of a third example of a position and a connection configuration of a resistor string and comparators according to the present embodiment.

FIG. 2 to FIG. 4 show configurations of the comparator blocks obtained by arranging the comparators C01 to C63 according to the above rule and then grouping eight (or seven) comparators.

The order of the comparators in the blocks is different in FIG. 2 and FIG. 3. In each of the comparator blocks shown in FIG. 2, the comparator having the smallest number is arranged at the least significant bit reference voltage VRB side, while the other comparators are arranged shifted to the most significant bit reference voltage VRT side as the number becomes larger. In each of the comparator blocks shown in FIG. 3, conversely the comparator having the smallest number is arranged at the most significant bit reference voltage VRT side, while the other comparators are arranged shifted to the least significant bit reference voltage VRB side as the number becomes larger.

Note, in FIG. 2 and FIG. 3, a portion where picking up lines of the reference voltages are partially crowded occurs. This interconnection pitch usually does not affect the layout, but if it is a case, the arrangement as in FIG. 4 can be considered.

In FIG. 4, each two pickup points of the reference voltages are laterally arranged, and interconnections connected to these two pickup points are arranged horizontally in the form of a straight line. By this, the parallel stripe portions of the resistor string and the takeout interconnections exhibit a beautiful checkerboard state.

On the other hand, in FIG. 4, there is a difficulty that the bended portions of the resistor string do not line up horizontally. Instead, the top right and the left bottom in the figure is longer, so the layout space of the resistor string becomes larger.

Note that, in FIG. 4, it is also possible to reverse the arrangement order of comparators in the blocks as in the relationship between FIG. 2 and FIG. 3. The resistor string in that case projects out at the top left side and the bottom right side conversely to FIG. 4.

In the comparator blocks $3_{-1}$ to $3_{-7}$ for generating the least significant bits, signals E[i] are expressed by the following formula (7) (i: natural number in 1 to 7).

$$E[i] = (C[i] \quad \&! \, C[i+8]) \, | \qquad (7)$$
$$(C[i+16] \quad \&! \, C[i+24]) \, |$$
$$(C[i+32] \quad \&! \, C[i+40]) \, |$$
$$(C[i+48] \quad \&! \, C[i+56])$$

Figure 5:
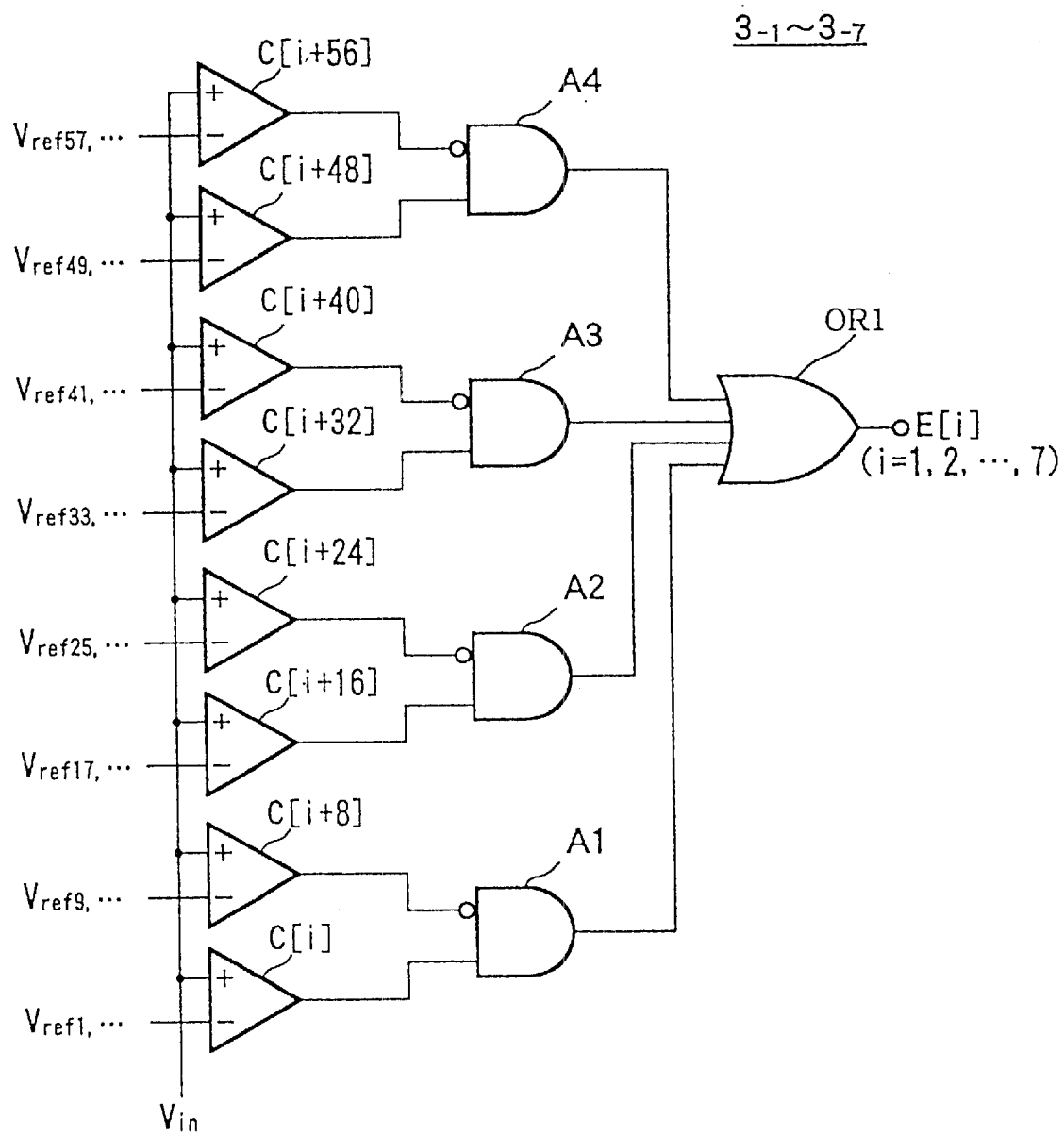
FIG. 5 is a logic circuit diagram of the configuration of comparator blocks of the least significant bits according to the present embodiment.

An example of the implementation of the formula (7) in the comparator blocks $3_{-1}$ to $3_{-7}$ is shown in FIG. 5.

Each of the comparator blocks $3_{-1}$ to $3_{-7}$ has eight comparators C[i], C[i+8], C[i+16], C[i+24], C[i+32], C[i+40], C[i+48], and C[i+56]. In the comparator block $3_{-1}$, i is 1, in the comparator block $3_{-2}$, i is 2, in the comparator block $3_{-3}$, i is 3, in the comparator block $3_{-4}$, i is 4, in the comparator block $3_{-5}$, i is 5, in the comparator block $3_{-6}$, i is 6, and in the comparator block $3_{-7}$, i is 7.

Also, each of the comparator blocks $3_{-1}$ to $3_{-7}$ has four AND gates A1, A2, A3, and A4 and one OR gate OR1. The output of the comparator C[i] and the invert of the output of the comparator C[i+8] are input to the AND gate A1, the output of the comparator C[i+16] and the invert of the output of the comparator C[i+24] are input to the AND gate A2, the output of the comparator C[i+32] and the invert of the output of the comparator C[i+40] are input to the AND gate A3, and the output of the comparator C[i+48] and the invert of the output of the comparator C[i+56] are input to the AND gate A4. The outputs of the AND gates A1, A2, A3, and A4 are input to the OR gate OR1, and the signal E[i] is output from the OR gate OR1.

In the comparator block $3_{-8}$ for generating the most significant bits, signals F[2], F[1], and F[0] of the Gray code format expressed by the following equations (8-1), (8-2), and (8-3) are generated.

$$F[2]=C[32] \qquad (8\text{-}1)$$
$$F[1]=C[16]\&!C[48] \qquad (8\text{-}2)$$
$$F[0] = (C[8] \,\&\, !C[24]) \, | \qquad (8\text{-}3)$$
$$(C[40] \,\&\, !C[56]) \, |$$

Figure 6:
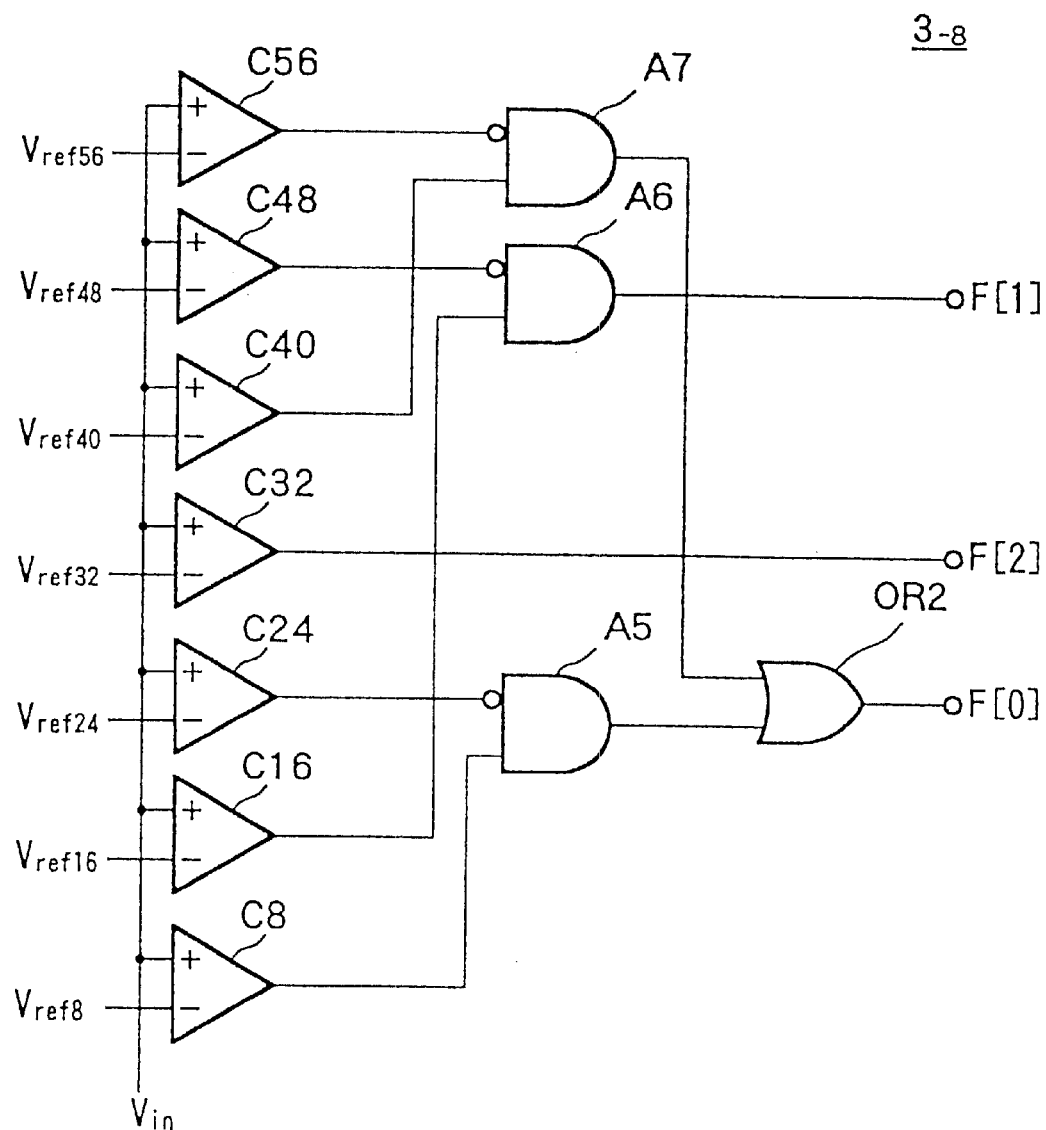
FIG. 6 is a logic circuit diagram of the configuration of comparator block of the most significant bits according to the present embodiment.

An example of the implementation of the comparator block $3_{-8}$ realizing these formulae (8-1), (8-2), and (8-3) is shown in FIG. 6.

The comparator block $3_{-8}$ has seven comparators C[8], C[16], C[24], C[32], C[40], C[48], and C[56].

Also, the comparator block $3_{-8}$ has three AND gates A5, A6, and A7 and one OR gate OR2. The output of the comparator C[8] and the invert of the output of the comparator C[24] are input to the AND gate A5, the output of the comparator C[16] and the invert of the output of the comparator C[48] are input to the AND gate A6, and the output of the comparator C[40] and the invert of the output of the comparator C[56] are input to the AND gate A7. The outputs of the AND gates A5 and A7 are input to the OR gate OR2. The signal F[0] is output from the OR gate OR2, the signal F[1] is output from the AND gate A6, and the signal F[2] is output from the comparator C[32].

The most significant 3 bits of the binary code format output signals ADB[5], ADB[4], and ADB[3] of the ADC 1 according to the present embodiment are obtained by converting the signals F[2], F[1], and F[0] output from this comparator $3_{-8}$ by using the following Gray-binary conversion formulae (9-1), (9-2), and (9-3). This code conversion is executed in the first output circuit 4 of FIG. 1.

$$ADB[5]=F[2] \qquad (9\text{-}1)$$
$$ADB[4]=F[1]*F[2] \qquad (9\text{-}2)$$
$$ADB[3]=F[0]*F[1]*F[2] \qquad (9\text{-}3)$$

Figure 7:
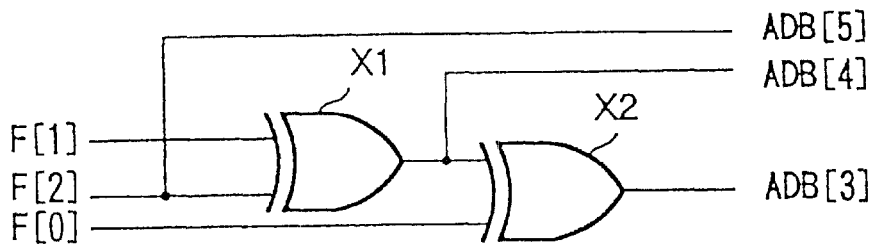
FIG. 7 is a logic circuit diagram of a Gray-binary conversion circuit in a first output circuit according to the present embodiment.

An example of the circuit for realizing these logic formulae is shown in FIG. 7.

This circuit is comprised of two XOR gates X1 and X2. F[2] is output as it is as ADB[5], ADB[4] is taken out from the output of the XOR gate X1 receiving as input F[1] and F[2], and ADB[3] is output from the XOR gate X2 receiving as input the output of the XOR gate X1 and F[0].

Also, the least significant 3 bits of the binary code format output signals ADB[2], ADB[1], and ADB[0] of the ADC 1 are created by the following formulae (10-1), (10-2), and (10-3) by using the ADB[3] generated by the logic equation of the above formula (9-3) and the signals E[1] to E[7] output from the comparators $3_{-1}$ to $3_{-7}$. The least significant bits are generated in the second output circuit 5 of FIG. 1.

$$ADB[2] = E[4] * ADB[3] \tag{10-1}$$

$$ADB[1] = (E[2] * E[4]) | \\ (E[6] * ADB[3]) \tag{10-2}$$

$$ADB[0] = (E[1] * E[2]) | \\ (E[3] * E[4]) | \\ (E[5] * E[6]) | \\ (E[7] * ADB[3]) \tag{10-3}$$

Figure 8:
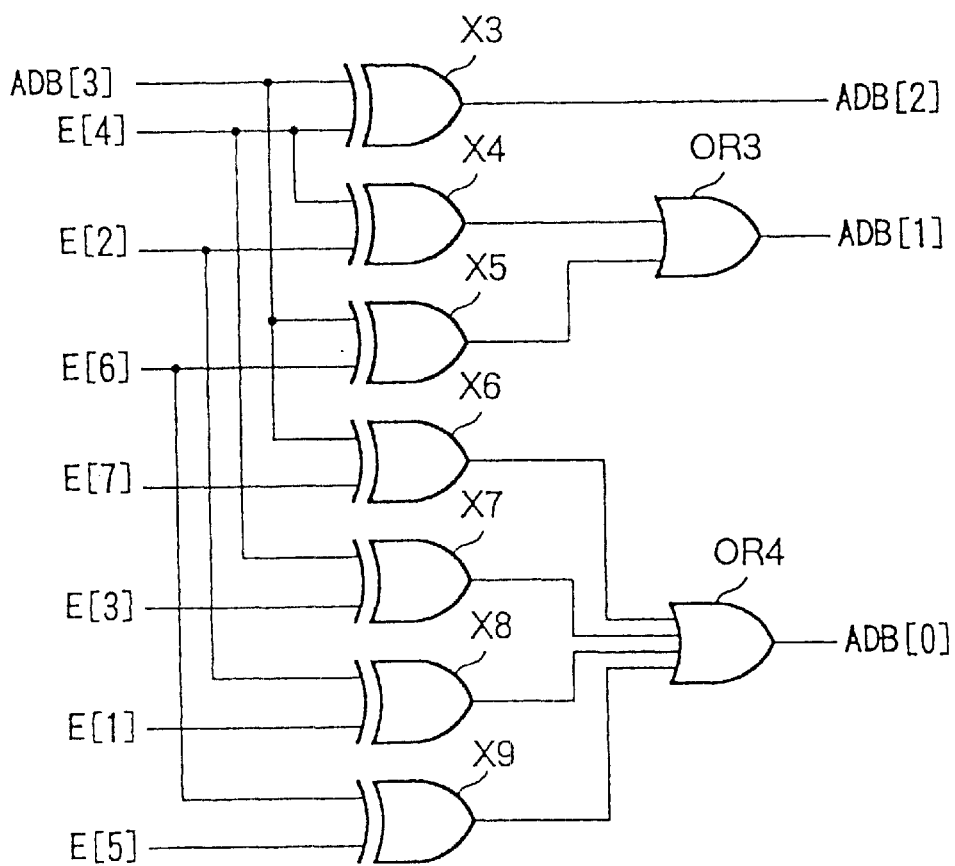
FIG. 8 is a logic circuit diagram of a lower significant bit generation circuit in a second output circuit according to the present embodiment.

An example of the circuit for realizing these logic formulae is shown in FIG. 8.

This circuit is comprised of seven XOR gates X3 to X9 and two OR gates OR3 and OR4. ADB[2] is output from the XOR gate X3 with E[4] and ADB[3] input thereto. E[2] and E[4] are input to the XOR gate X4, E[6] and ADB[3] are input to the XOR gate X5, and ADB[1] is output from the OR gate OR3 with the outputs of the XOR gates X4 and X5 input thereto. E[7] and ADB[3] are input to the XOR gate X6, E[3] and E[4] are input to the XOR gate X7, E[1] and E[2] are input to the XOR gate X8, E[5] and E[6] are input to the XOR gate X9, and ADB[0] is output from the 4-input OR gate OR4 with the outputs of the XOR gates X6 to X9 input thereto.

In this circuit of FIG. 8, there is one stage of XOR gate, so the stage number of the XOR gates is three when this is combined with the circuit of FIG. 7, and a 6-bit output is obtained. Also, even if the number of bits of the ADC increases, only the number of inputs of the OR gates increases, and the stage number of the XOR gates does not increase more than this. Accordingly, suppressing the increase of the pipeline delay is realized.

Note that, the actual circuit is not a simple combination logic. Some latch circuits are appropriately placed in the way of encoding. Namely, as the most significant bit (MSB) described in formula (9-1), as will be mentioned later, F[2] is already existing as it is, but usually a latch stages for delaying the output by exactly the same amount of clocks as the number of stages of the least significant bits is necessary to match the pipeline delay. Similarly, the bits described in formula (9-2), formula (9-3), and further formula (10-1) and formula (10-2) must have the same amount of delay of the least significant bit (LSB), so some latch circuits or delay stages for this purpose become necessary. The latch circuits are placed in the circuit 4 or the circuit 5 of FIG. 1 or the comparator blocks $3_{-1}$ to $3_{-8}$.

Figure 9:
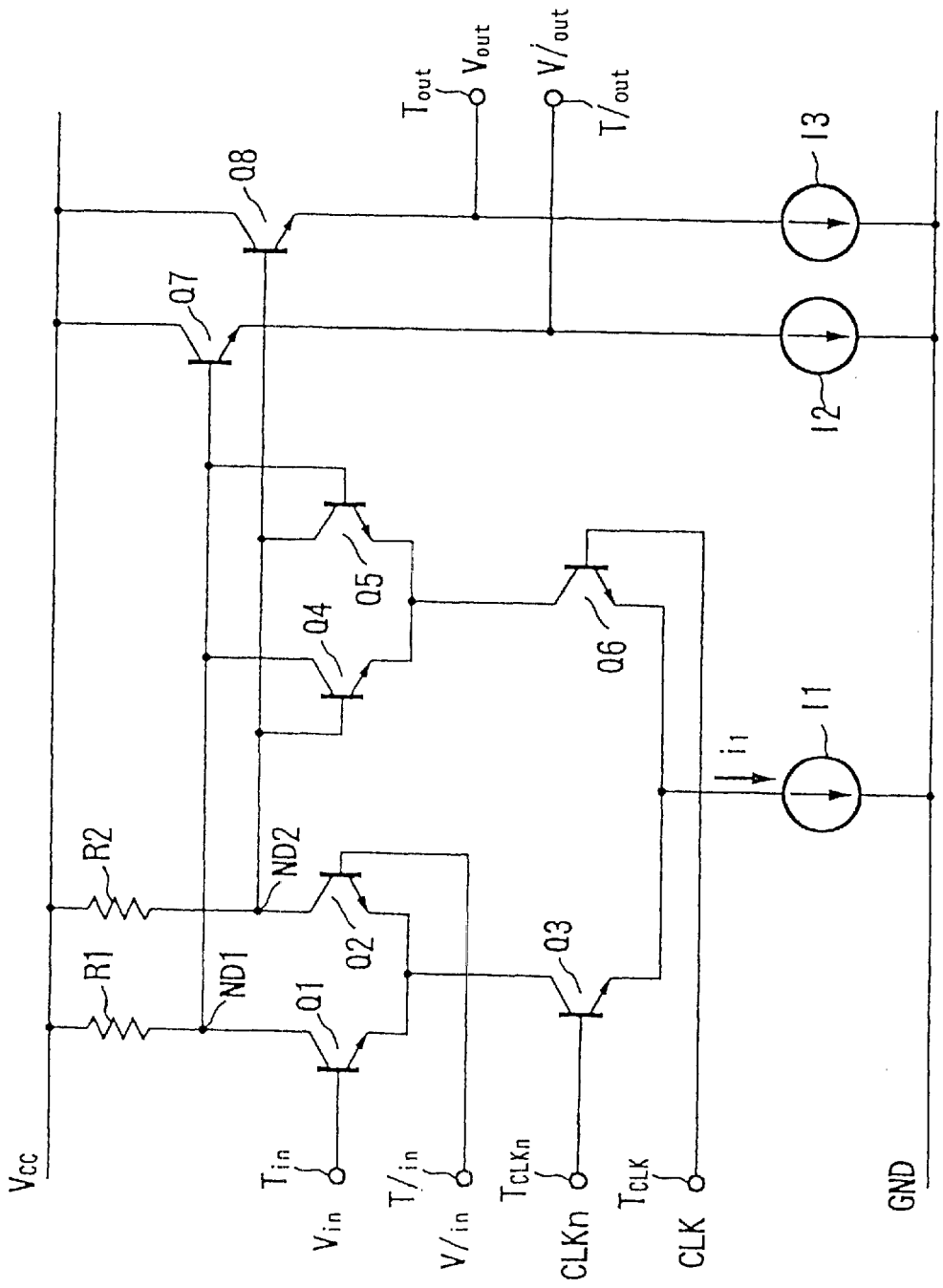
FIG. 9 is a circuit diagram of an example of a latch circuit which can be applied to an ADC according to the present embodiment.
Figure 10:
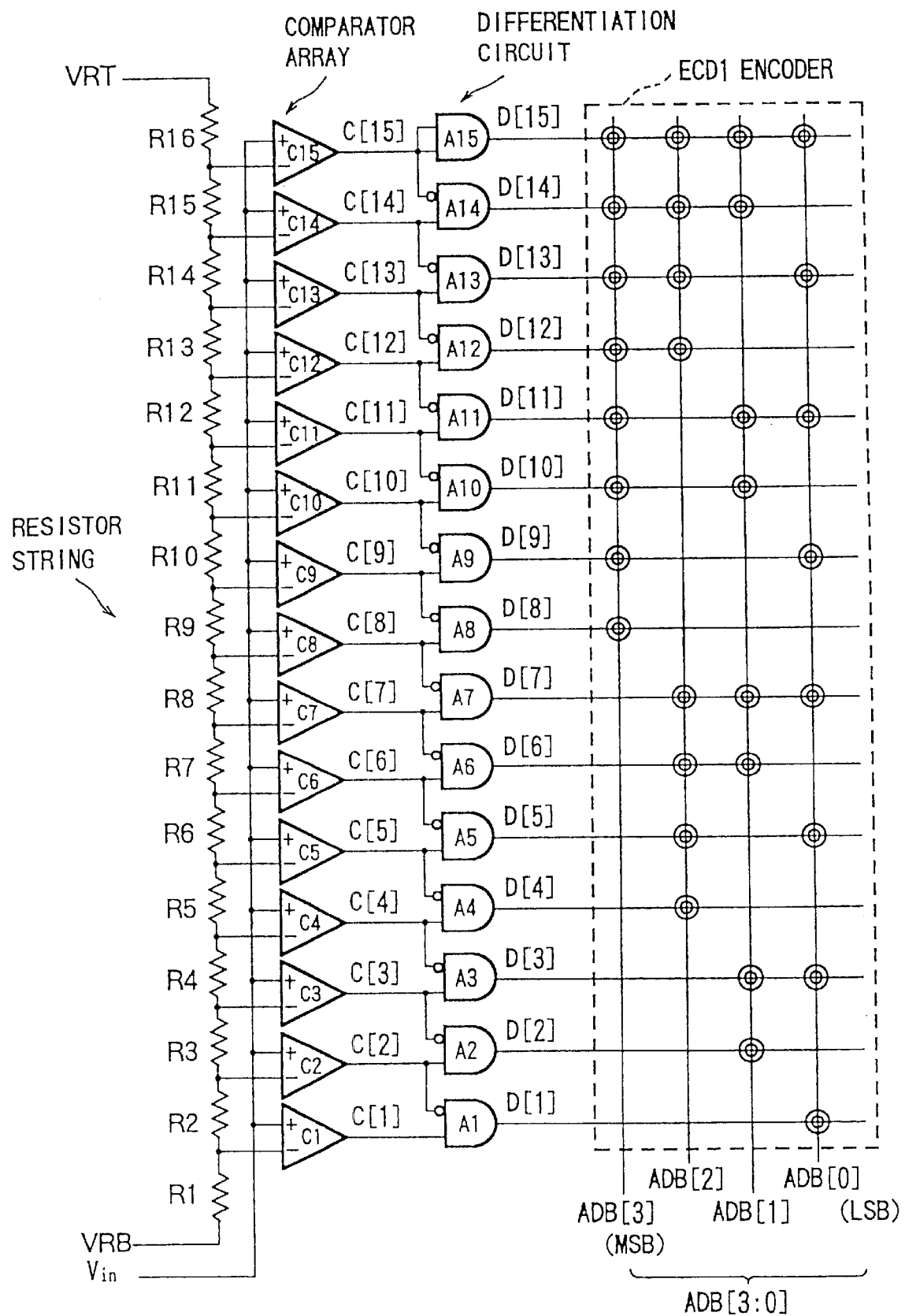
FIG. 10 is a view of an example of the configuration of a conventional flash type ADC.
Figure 11:
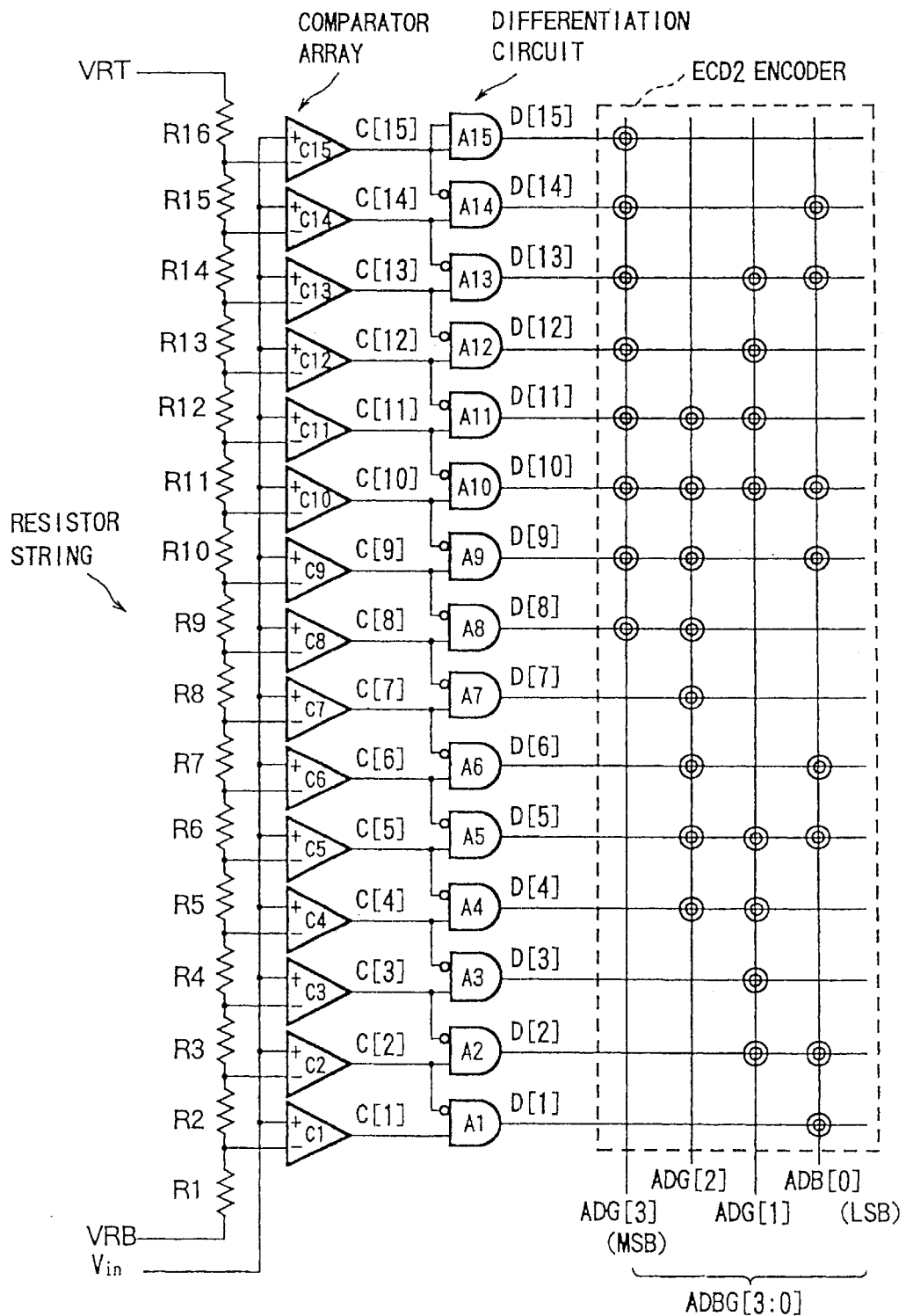
FIG. 11 is a view of another example of the configuration of the conventional flash type ADC.

FIG. 9 shows an example of the latch circuit.

The latch circuit of the present example is comprised of a transfer stage and a latch stage. The former is comprised of npn transistors Q1 to Q3. The latter is comprised of npn transistors Q5 to Q7.

The transfer stage is a differential amplifier.

The base of the npn transistor Q1 is connected to an input terminal Tin of the analog signal Vin, and the collector is connected to a supply line of a power supply voltage $V_{cc}$ via the resistor element R1. The base of the npn transistor Q2 is connected to an input terminal T/in of a reference voltage V/in, and the collector is connected to the supply line of the power supply voltage $V_{cc}$ via the resistor element R2. Connection points of the collectors of these npn transistors with the resistor elements form nodes ND1 and ND2. The emitters of the npn transistors Q1 and Q2 are commonly connected to the collector of the npn transistor Q3.

The latch stage is comprised of the npn transistors Q4, Q5, and Q6.

The base of the npn transistor Q4 is connected to the node ND2, the collector is connected to the node ND1, the base of the npn transistor Q5 is connected to the node ND1, and the collector is connected to the node ND2. The emitters of these npn transistors are commonly connected to the collector of the npn transistor Q6.

Further, the base of the npn transistor Q3 is connected to an input terminal $T_{CLKn}$ of a clock signal CLKN, the base of the npn transistor Q6 is connected to an input terminal $T_{CLK}$ of a clock signal CLK, and the emitters of these npn transistors are commonly connected to the current source I1. Here, the clock signal CLKN is the inverted signal of the clock signal CLK.

An output circuit of the transfer stage is comprised of the npn transistors Q7 and Q8 and current sources I2 and I3.

The base of the npn transistor Q7 is connected to the node ND1, the collector is connected to the supply line of the power supply voltage $V_{cc}$, and the emitter is connected to the current source I2. The base of the npn transistor Q8 is connected to the node ND2, the collector is connected to the supply line of the power supply voltage $V_{cc}$, and the emitter is connected to the current source I3.

Further, the emitter of the npn transistor Q8 is connected to an output terminal Tout of the comparator, and the emitter of the npn transistor Q7 is connected to an inverted output terminal T/out of the comparator.

During half a period where the clock signal CLKN is high, a current $i_1$ of the current source I1 flows through the collector of the npn transistor Q3, the differential amplifier comprised of the npn transistors Q1 and Q2 are active, and the potentials of the collectors of these transistors, that is, the nodes ND1 and ND2, are determined in accordance with the levels of the analog voltage Vin and the reference voltage V/in. For example, when the level of the analog signal Vin is higher than the reference voltage V/in, the node ND1 is a low level, and the node ND2 is a high level. During the period, since the clock signal CLK is low, the current does not flow through the collector of the npn transistor Q6, and the latch stage is not active.

After the clock signal CLKN is turned to low, the current does not flow through the collector of the npn transistor Q3, but the current flows through the collector of the npn transistor Q6, the latch stage becomes active, and the potentials of the nodes ND1 and ND2 are kept.

In this way, during the period when the clock signal CLKN is high and the clock signal CLK is low, the difference between the analog signal Vin and the reference voltage V/in is amplified by the differential amplifier and output to the nodes ND1 and ND2. During the period when the clock signal CLKN is low and the clock signal CLK is high, the potentials of the nodes ND1 and ND2 are kept by the latch stage.

The potentials of the nodes ND1 and ND2 are transferred to the output circuit comprised of the npn transistors Q7 and Q8 and the current sources I2 and I3 and output.

Note that, when the latch function is provided in the output stage of the second output circuit 5 of FIG. 1, the latch circuit and the output circuit in FIG. 9 are arranged in an output route of the required bits.

In this case, according to formula (9-1) to (10-3), a decision is made from the most significant bit, therefore, if necessary, the most significant bits can be output at an earlier clock (with a smaller pipeline delay) than the least significant bits. This feature is useful in some applications, for example, a case where a tentative decision of the input signal is required in a PRML channel.

In the ADC 1 according to the present embodiment, as mentioned above, the resistor string 2 was arranged folded by a number of times in accordance with the number of the most significant bits to make it easier to gather the comparators of most significant bits. The Gray code is generated at the comparator block $3_{-8}$ of the most significant bits, and Gray-binary conversion is carried out in the first output circuit 4 of the latter stage. Then, in the second output circuit 5 to generate the least significant bits, the circuit to generate the least significant bits from the outputs of the comparator blocks $3_{-1}$ to $3_{-7}$ and the output of the first output circuit 4 is realized by a circuit configuration that does not increase the pipeline delay even if the number of least significant bits is increased.

For this reason, in the ADC 1 according to the present embodiment, the stage number of the XOR gates, which has much influence on the pipeline delay, does not increase with the number of least significant bits. Also, the pipeline delay does not increase in accordance with the number of bits as in the Gray-binary conversion circuit in a conventional type ADC.

The bubble tolerance of the encoding method according to the present embodiment is equivalent to the conventional method of generating all bits by a Gray coding and then converting it to a binary code (hereinafter, referred to as the full bit Gray encoding). This is because the AND gates A1 to A7 of the comparator blocks $3_{-1}$ to $3_{-8}$ receive as input two reference voltages apart by at least 8 LSB each other and the comparison results of the input signals, so occurrence of the bubble apart by 8 LSB is rare enough to be negligible in terms of probability. For this reason, in the circuits of formula (7) (FIG. 5), the possible bubbles are prevented from becoming a sparkle in the circuit configuration. Also, even if a large bubble over eight-bits apart occurs and both of E[i] and E[i+1]become 1, as apparent from the configurations of formula (10-1) to (10-3), that will not become a sparkle.

The metastable state tolerance of the encoding method according to the present embodiment is slightly inferior to the full bit Gray encoding in theory. The most significant bits are the Gray code per so, so are equivalent, but in the least significant bits, for example E[4] simultaneously appears in the formulae (10-1) to (10-3) of lower significant 3 bits. The metastable state occurring at the time of generation of E[4] exerts an influence upon the lower significant 3 bits.

However, the sparkle of this generation mechanism is limited in magnitude thereof to the range of the lower significant bits. Also, in the encoder according to the present embodiment, the stage number of latches up to the stage of the creation of the least significant bits (input stages of formulae (9-1) to (10-3)) can be easily made larger than the conventional ROM type ADC of WOR configuration, so a great improvement can be expected in the sparkle frequency by this. As a general tendency, the sparkle due to the metastable state is reduced by an exponential function of the stage number of latches up to the latch input of the encoding stage exerting an influence upon the plurality of bits from the comparator output. Accordingly, in the ADC according to the present embodiment, by increasing the stage number of latches, a metastable state tolerance practically the same as that of the conventional method can be guaranteed.

Note that, FIG. 5 to FIG. 8 realize corresponding logic formulae, but if identical logic operation results are obtained, they are not limited to the illustrated circuits. Particularly, the 4-input OR gates OR1 and OR4 in FIG. 5 and FIG. 8 may be realized by for example WOR too.

Also, there is no limit to the number of higher significant bits. Accordingly, the number of folds of the resistor string is not limited to the illustrated one.

The method of picking up the reference voltages and the arrangement of the comparator blocks can be realized by methods and arrangements other than illustrated. Particularly, the arrangement of the comparator block $3_{-8}$ for creating the higher significant bits on the least significant bit reference voltage VRB side can be easily executed as a modification not accompanied with any other significant change.

According to the flash type analog-to-digital converter according to the present invention, the resistor string is arranged by folding by number of times corresponding to the number of the most significant bits of the output bits. By this, comparators of most significant bits are arranged adjacently. As a result, generation of a Gray code for the most significant bits becomes easier. For the most significant bit width is smaller, the number of serial stages of the operation elements (XOR gates) of the exclusive OR for the Gray-binary conversion in the first output circuit also becomes small. Also, in the second output circuit, even if the number of the least significant bits is increased, the stage number of XOR gates does not increase by more than one. Accordingly, the increase of the pipeline delay is suppressed to the required lowest limit.

Though a Gray code is used partially in this invention, an operation reliability (sparkle tolerance) is almost equivalent to that of the full bit Gray encoding.

Also, according to the present invention, the resistor string can be arranged at the center portion of the ADC, so a good integral linearity is achieved.

From the above, according to the present invention, a flash analog-to-digital converter with a pipeline delay as small as that of the encoding method using a binary code for all bits can be realized while maintaining a good error-rate performance equivalent to that of an encoding method using a full bit Gray encoding.

Note that the present invention is not limited to the above embodiments and includes modifications within the scope of the claims.

What is claimed is:

1. A flash type analog-to-digital converter comprising a resistor string to generate reference voltages when detecting a voltage level of an input signal at the time of conversion of an analog input signal to a digital code of predetermined bits, wherein the resistor string is folded $2^n$ times or a multiple thereof corresponding to a number n of most significant bits when the predetermined bits N are divided to most significant bits and least significant bits.

2. A flash type analog-to-digital converter as set forth in claim 1, further comprising:

a first encoder for encoding n bits Gray code; and a second encoder for encoding the remaining N-n bit.

3. A flash type analog-to-digital converter as set forth in claim 2, wherein said first and second encoders have $(2^N-1)$ comparators receiving as input the reference voltages different by predetermined voltage steps and the input signal, comparing the input signal with the reference voltages, and creating outputs of logics in accordance with the relative magnitudes, and the ($2^N-1$) comparators are grouped into $2^{N-n}$ blocks of comparators receiving as input the reference voltages different by increments of $2^{N-n}$ times the predetermined voltage step and are arranged around the resistor string.

4. A flash type analog-to-digital converter as set forth in claim 3, wherein the first encoder directly converts a thermometer code output by the comparators in the blocks to a Gray code.

5. A flash type analog-to-digital converter as set forth in claim 3, wherein the second encoder comprises:
- a plurality of logic circuits for detecting state change of logics of (2m−1)th comparator outputs and 2m-th comparator outputs (m: natural number of $2^{n-1}$ or less) in the blocks; and
- an OR gate circuit for operating a logical sum of the outputs of the plurality of logic circuits and outputting the same.

6. A flash type analog-to-digital converter as set forth in claim 2, further comprising:
- a first output circuit for converting the Gray code output from the first encoder to a binary code and creating n bits of digital signal; and
- a second output circuit to generate the remaining bits of digital signal except the n bits among the predetermined bits N by using the digital signal generated by the related first output circuit and the output of the second encoder.

7. A flash type analog-to-digital converter as set forth in claim 6, wherein the first output circuit outputs all or part of the n bits earlier than the other bits.

8. A flash type analog-to-digital converter as set forth in claim 1, further comprising ($2^N-1$) comparators receiving as input the reference voltages different by predetermined voltage steps and the input signal, comparing the input signal with the reference voltages, and creating outputs of logics in accordance with the relative magnitudes,
- the ($2^N-1$) comparators being grouped into $2^{N-n}$ blocks of comparators receiving as input the reference voltages different by increments of $2^{N-n}$ times the predetermined voltage step and being arranged around the resistor string.

9. A flash type analog-to-digital converter as set forth in claim 1, wherein the resistor string is arranged around the center.

10. A flash type analog-to-digital converter for generating a plurality of reference voltages different in increments of predetermined voltage steps, comparing the related plurality of reference voltages and an analog input signal in voltage in parallel to detect the voltage level of the analog input signal, and converting the same to a digital code of predetermined bits, comprising:
- a first encoder for encoding most significant n bits of the predetermined bits N and outputting a Gray code;
- a second encoder for encoding the remaining bit among the predetermined bits N and outputting the same;
- a first output circuit for converting the Gray code output from the first encoder to a binary code and creating n bit of digital code; and
- a second output circuit for generating the remaining bit of the digital code except the n bits from the predetermined bits N by using the digital code generated by the related first output circuit and the output of the second encoder.

11. A flash type analog-to-digital converter as set forth in claim 10, wherein said first and second encoders have ($2^N-1$) comparators receiving as input the reference voltages different by predetermined voltage steps and the input signal, comparing the input signal with the reference voltages, and generating outputs of logics in accordance with the relative magnitudes, and
- the ($2^N-1$) comparators are grouped into $2^{N-n}$ blocks of comparators receiving as input the reference voltages different by increments of $2^{N-n}$ times the predetermined voltage step.

12. A flash type analog-to-digital converter as set forth in claim 11, wherein the first encoder directly converts a thermometer code output by the comparators in the blocks to a Gray code.

13. A flash type analog-to-digital converter as set forth in claim 11, wherein the second encoder comprises:
- a plurality of logic circuits for detecting state change of logics of (2m−1)th comparator outputs and 2m-th comparator outputs (m: natural number of $2^{n-1}$ or less) in the blocks; and
- an OR gate circuit for operating a logical sum of the outputs of the plurality of logic circuits and outputting the same.

14. A flash type analog-to-digital converter as set forth in claim 10, wherein the first output circuit outputs all or part of the n bits earlier than the other bits.

15. A flash type analog-to-digital converter comprising:
- a plurality of comparators and a resistor string, said plurality of comparators being ($2^N-1$) comparators, "N" being the number of predetermined bits for said flash type analog-to-digital converter, said plurality of comparators generating at least one most significant bit,
- a comparator of said plurality of comparators having a comparator input, said comparator input being electrically connected to said resistor string,
- said resistor string generating a plurality of reference voltages, a reference voltage of said plurality of reference voltages being applied to said comparator input,
- said total number of bits having at least one most significant bit, said resistor string being folded a number of times, said number of times corresponding to a number n of most significant bits of said at least one most significant bit.

16. A flash type analog-to-digital converter as set forth in claim 15, wherein said plurality of comparators generates at least one least significant bit,
- said at least one most significant bit being represented by one digital code and said at least one least significant bit being represented by another digital code different from said one digital code.

17. A flash type analog-to-digital converter as set forth in claim 16, wherein said one digital code is a Gray code.

18. A flash type analog-to-digital converter as set forth in claim 15, wherein said resistor string generates said plurality of reference voltages when detecting a voltage level of an input signal at the time of conversion of an analog input signal to a digital code of predetermined bits, wherein
- the resistor string is folded 2n times or a multiple thereof corresponding to said number n of most significant bits when said predetermined bits N are divided to said most significant bits and least significant bits.

19. A flash type analog-to-digital converter as set forth in claim 15, wherein said number of times corresponding to the number of most significant bits, "n" being said number of most significant bits.

20. A flash type analog-to-digital converter as set forth in claim 15, wherein said resistor string has a serpentine shape.

21. A flash type analog-to-digital converter as set forth in claim 15, wherein said resistor string is a voltage divider network, said voltage divider network generating said plurality of reference voltages.

22. A flash type analog-to-digital converter comprising:
a first encoder, a second encoder, a first output circuit and a second output circuit,
said first encoder outputting at least one most significant bit predetermined bits N, "N" being the number of predetermined bits for said flash type analog-to-digital converter,
said second encoder outputting at least one least significant bit of said predetermined bits,
said first output circuit converting said at least one most significant bit into one code,
said second output circuit converting said at least one least significant bit into another code, said another code different from said one code.

23. A flash type analog-to-digital converter as set forth in claim 22, wherein said first encoder outputs said one code as a digital code.

24. A flash type analog-to-digital converter as set forth in claim 22, wherein said one code is Gray code.

25. A flash type analog-to-digital converter as set forth in claim 22, wherein said second encoder outputs said another code as a digital code.

* * * * *